(12) United States Patent
Shimizu

(10) Patent No.: US 10,527,679 B2
(45) Date of Patent: Jan. 7, 2020

(54) RECHARGEABLE BATTERY REMAINING CAPACITY DETECTION CIRCUIT, ELECTRONIC MACHINE AND VEHICLE USING THE SAME, AND STATE OF CHARGE DETECTION METHOD

(71) Applicant: ROHM CO., LTD., Kyoto (JP)

(72) Inventor: Takahiro Shimizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 144 days.

(21) Appl. No.: 15/708,569

(22) Filed: Sep. 19, 2017

(65) Prior Publication Data
US 2018/0080993 A1 Mar. 22, 2018

(30) Foreign Application Priority Data

Sep. 21, 2016 (JP) ................. 2016-184675

(51) Int. Cl.
*G01R 31/367* (2019.01)
*G01R 31/382* (2019.01)
*G01R 31/3828* (2019.01)

(52) U.S. Cl.
CPC ......... *G01R 31/367* (2019.01); *G01R 31/382* (2019.01)

(58) Field of Classification Search
CPC .... G01R 31/367; G01R 31/36; G01R 31/382; G01R 31/3828; G01R 31/3833; G01R 31/3842; G01R 31/40
See application file for complete search history.

(56) References Cited

U.S. PATENT DOCUMENTS 9,035,616 B2 5/2015 Wortham

OTHER PUBLICATIONS

Prashanth et al., Estimation of SOC and SOH of Li-Ion Batteries, Oct. 2014, International Journal of Computer Applications, vol. 104, No. 4, pp. 45-49 (Year: 2014).*

* cited by examiner

*Primary Examiner* — Toan M Le
(74) *Attorney, Agent, or Firm* — Cantor Colburn LLP

(57) ABSTRACT

The present invention provides an improved method for detecting the state of charge (SOC) of a battery. A remaining capacity detection circuit detects the SOC of a rechargeable battery. A coulomb counter circuit integrates the charge and discharge currents $I_{BAT}$ of the battery to generate a coulomb count value CC. A voltage detection circuit detects a voltage $V_{BAT}$ of the battery. An SOC calculation unit calculates a raw SOC value SOC_cc based on the coulomb count value CC. A discharge correction unit corrects the raw SOC value SOC_cc based on a voltage drop of the battery during the discharging of the battery, and generates a discharge SOC value SOC_dis. A charge correction unit measures a minimum value SOC_dis_min reached by the discharge SOC value SOC_dis during the last discharge of the battery, and calculates a charge SOC value SOC_chg using the minimum value SOC_dis_min during the charging of the battery.

18 Claims, 12 Drawing Sheets

| SOC (%) | battery voltage during charging (V) |
|---|---|
| 100 | 4.20 |
| 90 | 4.20 |
| 80 | 4.20 |
| 70 | 4.10 |
| 60 | 4.00 |
| 50 | 3.90 |
| 40 | 3.85 |
| 30 | 3.80 |
| 20 | 3.75 |
| 10 | 3.70 |
| 0 | 3.65 |

FIG. 7

| SOC(%) | OCV(V) |
|---|---|
| 100 | 4.20 |
| 90 | 4.07 |
| 80 | 3.99 |
| 70 | 3.93 |
| 60 | 3.87 |
| 50 | 3.82 |
| 40 | 3.79 |
| 30 | 3.77 |
| 20 | 3.74 |
| 10 | 3.69 |
| 0 | 3.40 |

FIG. 8

RECHARGEABLE BATTERY REMAINING CAPACITY DETECTION CIRCUIT, ELECTRONIC MACHINE AND VEHICLE USING THE SAME, AND STATE OF CHARGE DETECTION METHOD

CROSS REFERENCE TO RELATED APPLICATIONS

The present invention claims priority under 35 U.S.C. § 119 to Japanese Patent Application No. 2016-184675 filed on Sep. 21, 2016, the entire content of which are incorporated herein by reference.

BACKGROUND

1. Field of the Invention

The present disclosure relates to battery management systems.

2. Description of Related Art

Electronic machines, such as mobile phone terminals, digital cameras, tablet terminals, portable music players, handheld game consoles and laptops, are powered by various types of batteries; these machines are configured with a rechargeable battery (secondary battery), whereas the central processing unit (CPU) for system control and signal processing, liquid crystal panel, wireless communication module, and other electronic circuits like analog or digital circuits are powered by the electric energy from the battery.

FIG. 1 is a block diagram of a battery-driven electronic machine. The electronic machine 500 comprises a battery 502 and a charging circuit 504 for charging the battery 502. The charging circuit 504 receives the power supply voltage $V_{ADP}$ from an external power adaptor or universal serial bus (USB) to charge the battery 502.

The battery 502 connects with a load 508. The current $I_{BAT}$ flowing through the battery 502 becomes the difference of the current $I_{CHG}$ from the charging circuit 504 and the load current (discharging current) $I_{LOAD}$ flowing through the load 508.

In the battery-driven electronic machine, the detection of the remaining capacity (state of charge, SOC) of the battery has become an indispensable function; hence, a remaining capacity detection circuit 506 is disposed in the electronic machine 500. The remaining capacity detection circuit 506 is also referred to as the Whewell gauge integrated circuit (IC). The voltage method and coulomb calculation method (charge accumulation method) are two mainstream methods for detecting the remaining capacity of the battery using the remaining capacity detection circuit 506. There are also some cases in which the charging circuit 504 is placed in the remaining capacity detection circuit 506.

In the voltage method, the open circuit voltage OCV of the battery is determined in an open state (no-load state), and the remaining capacity is determined according to the corresponding relationship between the OCV and SOC. It is not feasible to determine OCV when the battery is in the no-load and non-relaxed state, and therefore, it is not possible to correctly determine the remaining capacity during the charging or discharging.

In the coulomb calculation method, the remaining capacity is determined by integrating the charging current flowing into the battery and the discharging current flowing out from the battery (hereinafter referred to as charge and discharge current) to calculate the amount of charged electric charges and the amount of discharged electric charges with respect to the battery. According to the coulomb calculation method, during the operating period of the battery in which an open voltage cannot be obtained, it is also feasible to determine the remaining capacity; this is a difference between the coulomb calculation method and the voltage method.

In FIG. 1, the remaining capacity detection circuit 506 uses the coulomb calculation method to determine the remaining capacity of the battery 502. The remaining capacity detection circuit 506 comprises a coulomb counter circuit 510 and an SOC calculation unit 512. The coulomb counter circuit 510 detects the current $I_{BAT}$ of the battery 502 and integrates the same. The coulomb count value CC generated by the coulomb counter circuit 510 is expressed as the following equation.

$$CC = \int I_{BAT} dt$$

Strictly speaking, the current $I_{BAT}$ of the battery is sampled by discrete-time sampling, which is calculated according to the following equation, wherein $\Delta t$ represents the sampling period.

$$CC = \Sigma(\Delta t \times I_{BAT})$$

The summation (integration) is carried out, for example, by setting the current $I_{BAT}$ flowing out from the battery 502 as positive and the current $I_{BAT}$ flowing into the battery 502 as negative.

The SOC calculation unit 512 calculates the SOC of the battery 502 based on the coulomb count value CC. The calculation of the SOC is according to the following equation.

$$SOC\,[\%] = (CC_{FULL} - CC) / CC_{FULL} \times 100$$

$CC_{FULL}$ represents the amount of electric charges (coulomb count value) stored in the battery 502 when it is fully charged.

PRIOR TECHNICAL LITERATURE

Patent Literature

[Patent literature 1] The specification of U.S. Pat. No. 9,035,616 B2.

BRIEF SUMMARY OF THE INVENTION

Problems to be Solved in the Present Invention

After studying the remaining capacity detection circuit 506 illustrated in FIG. 1, the present inventor has come to realize the following issues. The following discussion is directed to the phenomena that occur during the discharging period irrespective of charging. FIG. 2 is a diagram illustrating the relationship of OCV and SOC (SOC-OCV characteristics) and the variation of the battery voltage $V_{BAT}$. The horizontal axis represents the SOC based on the coulomb calculation method.

Taking the lithium ion cell for example, when OCV=4.2V, the battery is fully charged, i.e., SOC=100%. Further, in the case where the minimum operating voltage required for a system comprising the load 508 to operate is set as $V_{BAT\_MIN}$, then when $OCV=V_{BAT\_MIN}$, then SOC=0%. Other intermediate SOCs also show such one-to-one correspondence.

When the current $I_{LOAD}$ continuously or discontinuously flows through the load under the fully charged state, then the OCV decreases following the direction of the arrow shown in the drawing. By integrating the discharging current $I_{BAT}$ during this period, and calculating the SOC based on the coulomb count value CC, then the SOC will be close to zero with the passage of the time.

In FIG. 2, in addition to OCV, the battery voltage $V_{BAT}$ (broken line) of the battery 502 is also shown. The battery voltage $V_{BAT}$ is lower than OCV due to the internal resistance r of the battery. The amount of the drop (voltage drop) $V_{DROP}$ includes not only a component proportional to the load current $I_{LOAD}$ (i.e., the instantaneous value) but also a component based on the history of the past load current $I_{LOAD}$. When the load current $I_{LOAD}$ becomes zero, it does not become zero instantaneously. Under the no-load state, the voltage drop $V_{DROP}$ approaches zero after a longer and relaxed period (on the order of several hours). Further, the voltage drop $V_{DROP}$ also depends on the temperature.

As shown in FIG. 2, if, before the OCV decreases to $V_{BAT\_MIN}$, the battery voltage $V_{BAT}$ has decreased to $V_{BAT\_MIN}$ because of the voltage drop $V_{DROP}$, then the system is turned off. In such case, the SOC calculated using the coulomb calculation method is a value X that is greater than 0. That is, although a remaining battery capacity of X % is displayed, the user of the electronic machine 500 will still experience a system shutdown.

To address the above-described issue(s), the present invention develops a technique that corrects SOC by considering the voltage drop $V_{DROP}$. That is, the current SOC is corrected by presuming the current voltage drop $V_{DROP}$ and setting the SOC to zero when the battery voltage $V_{BAT}$ reaches the minimum operating voltage $V_{BAT\_MIN}$ of the system. Moreover, the above correction technique is not common knowledge in the field; rather, it is independently developed by the inventors of the present invention.

According to the above-described correction process, when the system is turned off, the SOC becomes 0%, which is consistent with the user's perception. However, the present inventor also recognizes further issues arising from the correction process. FIG. 3 is a diagram illustrating the further issues arising from the above-described SOC correction process.

The horizontal axis indicates the raw SOC_cc based on the coulomb calculation method and the SOC_corr obtained after the correction process. During the discharging period, the SOC_cc decreases from 100% to 20%. The battery voltage $V_{BAT}$ is lower than the OCV by the voltage drop $V_{DROP\_DIS}$. The scaling for the corrected SOC_corr is such that, when the battery voltage $V_{BAT}$ reaches the minimum operating voltage $V_{BAT\_MIN}$, the corrected SOC_corr is set to zero.

The charging starts when the SOC_cc decreases to 20%. During the charging period, the current flowing through the internal resistance r of the battery is opposite to the current during the discharging period, and hence, the battery voltage $V_{BAT}$ becomes higher than the OCV. The difference between the battery voltage $V_{BAT}$ during the charging and the OCV is set as $V_{DROP\_CHG}$. That is, when the battery is switched from discharging to charging, then the difference $V_{DROP}$ between the battery voltage $V_{BAT}$ and the OCV decreases drastically.

During the charging period, it is set that $V_{DROP}=0$; i.e., no SOC correction is performed. In this case, at the time when it is switched from discharging to charging, the SOC provided to the user will instantly change from the 9% of the SOC_corr to 20% of the SOC_cc, and approach 100% as the charging proceeds.

As such, when switching from discharging to charging, the SOC jump or drastic change due to the SOC correction based on the voltage drop $V_{DROP}$ results in a poor user experience.

The present invention aims to solve the above-described problem, and one purpose of the present invention is to improve the method for detecting the SOC.

Technical Means for Solving Problems

One aspect of the present invention is directed to a method for detecting the state of charge (SOC) of a rechargeable battery. The method comprises the following steps: generating a coulomb count value CC by integrating the charge and discharge currents of the battery; calculating a raw SOC value SOC_cc based on the coulomb count value CC; correcting the raw SOC value SOC_cc based on a voltage drop of the battery and generating a discharge SOC value SOC_dis during the discharging of the battery; obtaining a minimum value SOC_dis_min reached by the discharge SOC value SOC_dis during the last discharging of the battery; and calculating a charge SOC value SOC_chg using the minimum value SOC_dis_min during the charging of the battery.

According to this aspect, since the minimum value of the SOC during the most recent battery discharging is monitored, after the charging starts, the charge SOC value SOC_chg can be corrected in a way that does not result in an unnatural rise.

It is also feasible to set the charge SOC value SOC_chg so that it is matched with the minimum value SOC_dis_min when the charging starts. In this way, the discontinuous jump of the SOC when the charging starts can be prevented.

The method may further comprise a step of obtaining a minimum value SOC_cc_min reached by the raw SOC value SOC_cc during the discharging of the battery. The charge SOC value SOC_chg during the charging is calculated according to the equation (1) below.

$$SOC\_chg=SOC\_dis\_min+(SOC\_cc-SOC\_cc\_min)\times(100-SOC\_dis\_min)/(SOC\_cc\_min) \quad (1)$$

In this way, the charge SOC value SOC_chg during the charging may continuously increase from SOC_dis_min toward 100%.

The method according to another aspect may further comprise the following steps: preliminarily defining an SOC-VBAT characteristic representing a relationship between an SOC and a voltage of the battery during the charging; obtaining a voltage of the battery during the charging of the battery; and obtaining an SOC value SOC_est corresponding to the obtained voltage of the battery based on the SOC-VBAT characteristic.

Unlike the discharging current (the load current of the battery), the charging current is fixed and known, and therefore, there is a unique relationship between the voltage of the battery during the charging and the SOC. By using and maintaining the relationship as the SOC-VBAT characteristic, the SOC obtained based on the SOC-VBAT characteristic (i.e., the SOC_est) is used to replace the raw SOC value SOC_cc calculated during the charging based on the coulomb count value.

The charge SOC value SOC_chg during the charging can also be calculated according to the following equation (2).

$$SOC\_chg=SOC\_dis\_min+(SOC\_est-SOC\_cc\_min)\times(100-SOC\_dis\_min)/(SOC\_cc\_min) \quad (2)$$

In this way, the charge SOC value SOC_chg during the charging may continuously increase from SOC_dis_min toward 100%.

Yet another aspect of the present invention is directed to a method for detecting the state of charge (SOC) of a rechargeable battery. The method comprises the following steps: generating a coulomb count value CC by integrating charge and discharge currents of the battery; calculating a raw SOC value SOC_cc based on the coulomb count value CC; correcting the raw SOC value SOC_cc based on a voltage drop of the battery and generating a discharge SOC value SOC_dis during the discharging of the battery; obtaining a minimum value SOC_dis_min reached by the discharge SOC value SOC_dis during the last discharging of the battery; and generating a charge SOC value SOC_chg during the charging of the battery such that a value matches the minimum value SOC_dis_min when the charging starts.

According to the above-described aspect, the discontinuous jump of the SOC when the charging starts can be prevented.

The step of generating the discharge SOC value SOC_dis may further comprise the following steps: generating an open circuit voltage (OCV) value OCV1 corresponding to the raw SOC value SOC_cc based on the SOC-OCV characteristic showing a relationship between an SOC of the battery and an OCV; detecting a voltage $V_{BAT}$ of the battery; generating a difference $V_{DROP1}$ between the OCV value OCV1 and a detection value $V_{BAT1}$ of the voltage $V_{BAT}$ of the battery; generating a value OCV2 greater than the minimum operating voltage $V_{BAT\_MIN}$ of a system by a voltage width ΔV corresponding to the difference $V_{DROP1}$; generating an SOC value SOC2 corresponding to the OCV value OCV2 based on the SOC-OCV characteristic; and generating the discharge SOC value SOC_dis if the SOC value SOC2 corresponds to zero remaining capacity.

Still another aspect of the present invention is directed to a remaining capacity detection circuit for detecting a state of charge (SOC) of a rechargeable battery. The remaining capacity detection circuit comprises: a coulomb counter circuit for generating a coulomb count value CC by integrating the charge and discharge currents of the battery; a voltage detection circuit for detecting a voltage $V_{BAT}$ of the battery; an SOC calculation unit for calculating a raw SOC value SOC_cc based on the coulomb count value CC; a discharge correction unit for correcting the raw SOC value SOC_cc based on a voltage drop of the battery during the discharging of the battery, and generating a discharge SOC value SOC_dis; and a charge correction unit for measuring a minimum value SOC_dis min reached by the discharge SOC value SOC_dis during the last discharge of the battery, and calculating a charge SOC value SOC_chg using the minimum value SOC_dis_min during the charging of the battery.

According to the above-described aspect, since the minimum value of the SOC during the battery discharging is monitored, after the charging starts, the charge SOC value SOC_chg can be corrected in a way that does not result in an unnatural rise.

The remaining capacity detection circuit may further comprise a charge characteristic holding unit, in which the charge characteristic holding unit holds an SOC-VBAT characteristic representing a relationship between a voltage $V_{BAT}$ of the battery and SOC during the charging. The charge correction unit obtains an SOC value SOC_est corresponding to a voltage of the battery detected by the voltage detection circuit based on the SOC-VBAT characteristic.

The charge correction unit may also calculate the charge SOC value SOC_chg during the charging according to equation (2) below.

$$SOC\_chg = SOC\_dis\_min + (SOC\_est - SOC\_cc\_min) \times (100 - SOC\_dis\_min)/(SOC\_cc\_min) \quad (2)$$

Still another aspect of the present invention is directed to a remaining capacity detection circuit. The remaining capacity detection circuit comprises: a coulomb counter circuit for generating a coulomb count value CC by integrating the charge and discharge currents of the battery; a voltage detection circuit for detecting a voltage $V_{BAT}$ of the battery; an SOC calculation unit for calculating a raw SOC value SOC_cc based on the coulomb count value CC; a discharge correction unit for correcting the raw SOC value SOC_cc based on a voltage drop of the battery during the discharging of the battery, and generating a discharge SOC value SOC_dis; and a charge correction unit for measuring a minimum value SOC_dis_min reached by the discharge SOC value SOC_dis during the last discharging of the battery, and calculating a charge SOC value SOC_chg during the charging of the battery such that a value matches the minimum value SOC_dis_min when the charging starts.

Another aspect of the present invention is directed to an electronic machine. The electronic machine may comprise a rechargeable battery and any above-mentioned remaining capacity detection circuit for detecting the SOC of the battery.

Still another aspect of the present invention is directed to a vehicle. The vehicle may also comprise a rechargeable battery and any above-mentioned remaining capacity detection circuit for detecting the SOC of the battery.

Further, effective aspects of present invention also comprise any combinations of the above-mentioned constituting elements; alternatively, effective aspects of present invention also comprise the substitution among the constituting elements of the present invention and their applications in methods, devices, systems, etc.

Effects of the Present Invention

According to one aspect of the present invention, it is feasible to improve the SOC detection of a battery.

BRIEF DESCRIPTION OF THE DRAWINGS

FIG. 7 is a diagram showing an example of the SOC-VBAT characteristic.

FIG. 8 is a diagram showing an example of the SOC-OCV characteristic.

DETAILED DESCRIPTION

The present invention is described below based on preferred embodiments thereof by referencing to the appended drawings. Like or equivalent constituting elements, components and processes across various drawings are designated with the same or similar reference symbols, and repeated description thereof may be omitted where suitable. Also, the embodiments are provided for illustrative purposes and should not be construed to limit the scope of the claimed invention, while not all the features or combinations thereof are necessarily the essence of the claimed invention.

In this specification, the description regarding the status that "a component A is connected with/to a component B" includes not only the physical and direct connection between the component A and the component B, but also the indirect connection between the component A and the component B; as long as such indirect connection does not substantially affect the electric connection status therebetween or the functionality attained by such connection.

Similarly, the description regarding the status that "a component C is disposed between a component A and a component B" includes not only the physical and direct connection between the component A and the component C or between the component B and the component C, but also the indirect connection therebetween; as long as such indirect connection does not substantially affect the electric connection status therebetween or the functionality attained by such connection.

Further, in the present disclosure, the symbols labeled with the voltage signal, the current signal, or the resistance are used to represent the respective voltage value, the current value, or the resistance value depending on the need.

(First Embodiment)

Figure 1:
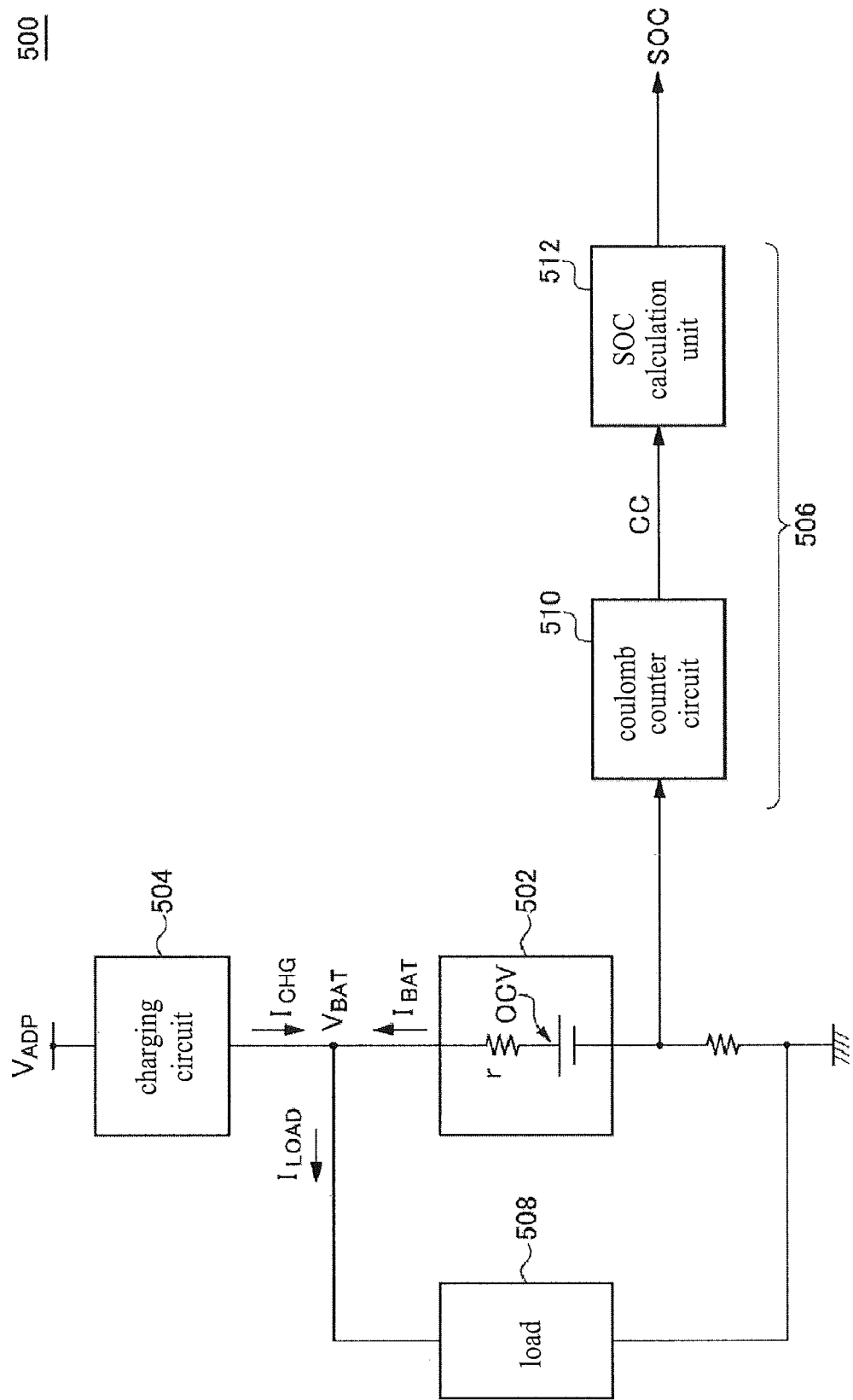
FIG. 1 is a block diagram of a battery-driven electronic machine.
Figure 2:
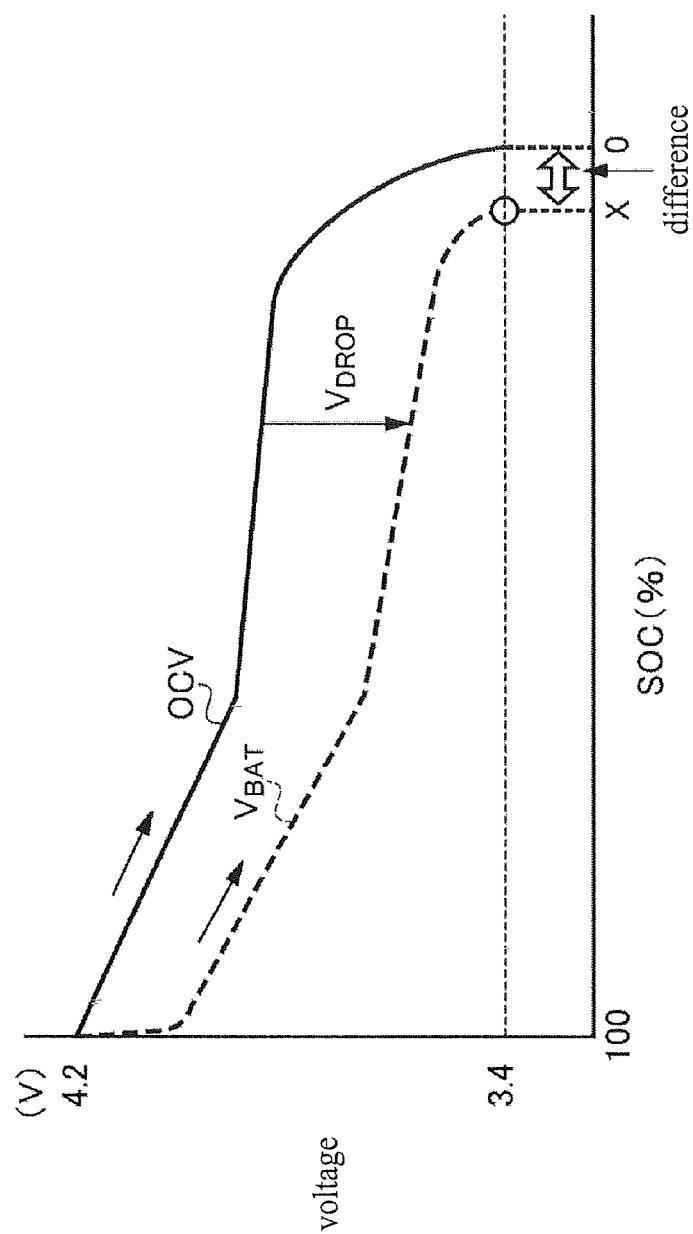
FIG. 2 is a diagram illustrating the relationship of OCV and SOC (SOC-OCV characteristics) and the variation of the battery voltage $V_{BAT}$.
Figure 3:
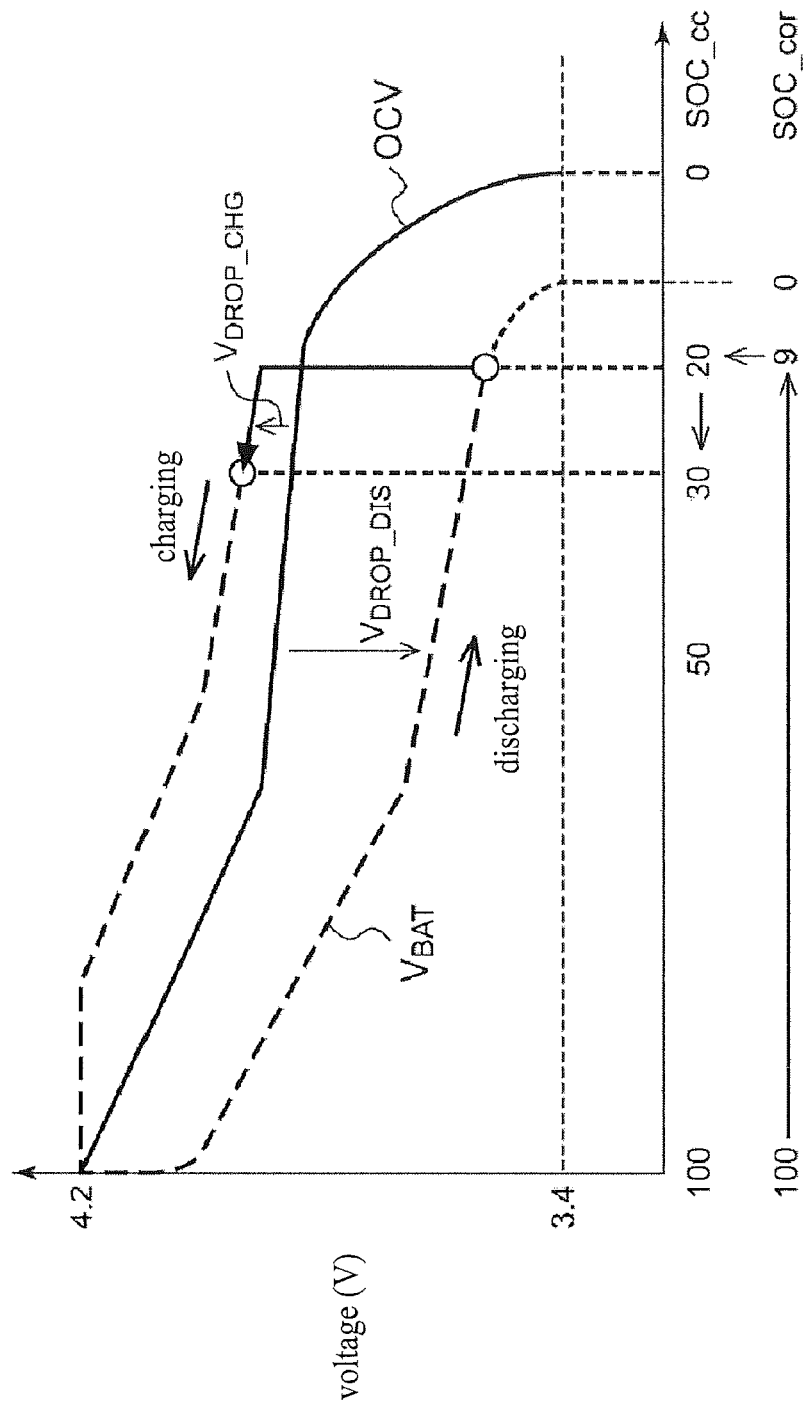
FIG. 3 is a diagram illustrating the issues arising from the SOC correction process.
Figure 4:
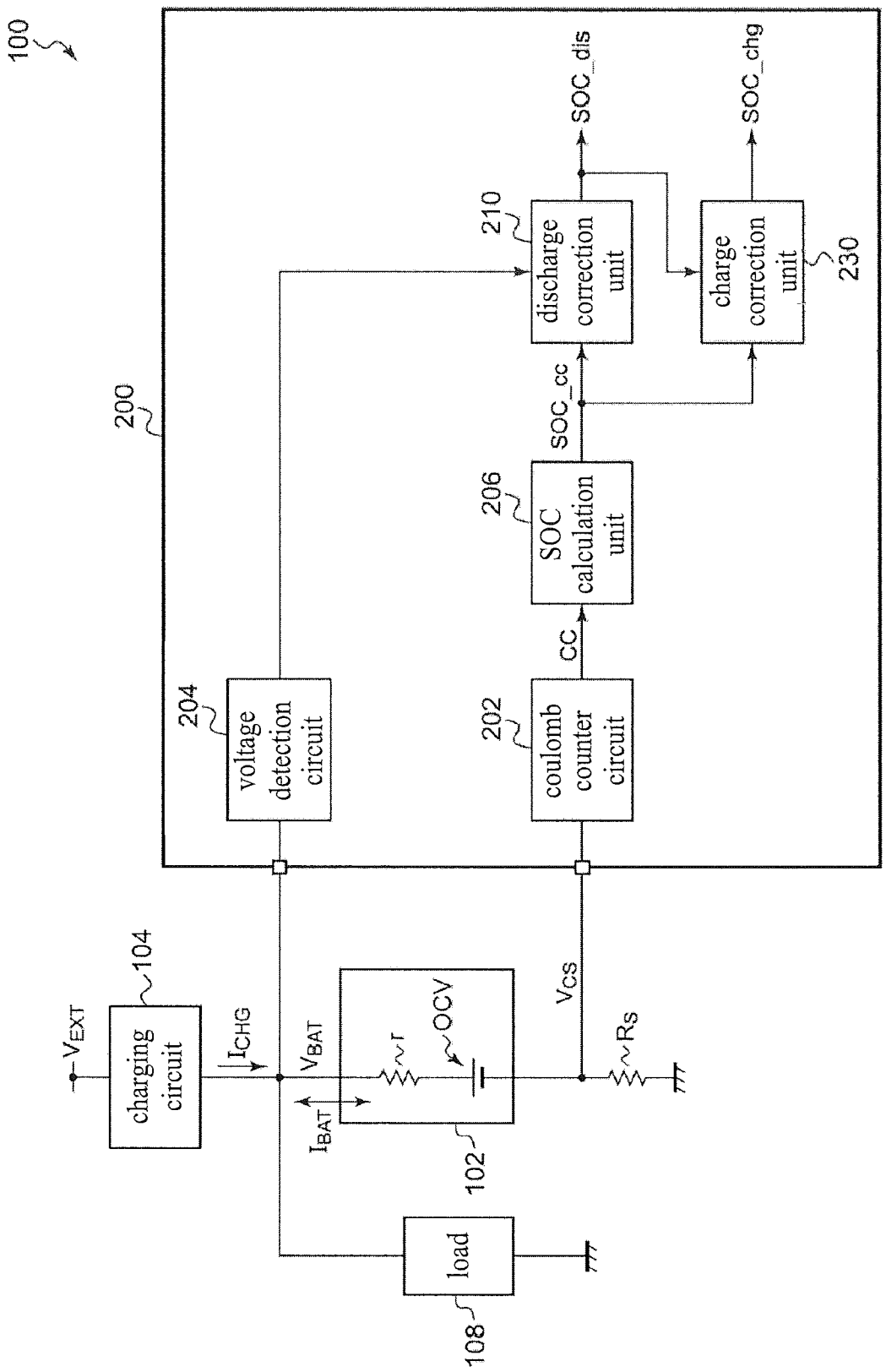
FIG. 4 is a block diagram of a battery management system comprising the remaining capacity detection circuit according to the first embodiment of the present disclosure.

FIG. 4 is a block diagram of a battery management system 100 comprising a remaining capacity detection circuit 200 according to the first embodiment of the present disclosure. The battery management system 100 comprises a rechargeable battery (secondary battery) 102, a charging circuit 104, a load 108, and the remaining capacity detection circuit 200. The battery 102 comprises one or more units. Examples of the types of the units include, but are not limited to, lithium-ion unit, lithium-air unit, lithium-metal based unit, nickel-hydrogen unit, nickel-cadmium unit, nickel-zinc unit, etc. The number of units depends on the application of the battery management system 100; when being applied in portable electronic machines, the number of units is usually on the order of one to several units, whereas when being applied in a vehicle-mounted battery or industrial apparatus or machine, the number of units is often on the order of tens or hundreds. The configuration of the battery 102 in the present invention is not of any particular limit.

The battery voltage $V_{BAT}$ from the battery 102 is supplied to the load 108. The types of the load 108 are not of any particular limit. For example, when the battery management system 100 is mounted in an electronic machine, the load 108 may comprise a power circuit for increasing or decreasing the battery voltage $V_{BAT}$ to generate a power supply voltage $V_{DD}$, or a variety of electronic circuits for receiving the power supply voltage $V_{DD}$ to operate. When the battery management system 100 is mounted in a vehicle or industrial machine, the load 108 may comprise a motor and an inverter for transforming the battery voltage $V_{BAT}$ into an alternating current voltage.

The charging circuit 104 receives a power supply voltage $V_{EXT}$ from an external power adaptor or universal serial bus (USB), charging station, etc., to charge the battery 102.

The remaining capacity detection circuit 200 can be used to detect the state of charge (SOC) of the battery 102. Moreover, in the present disclosure, to facilitate the understanding, the SOC is described with a minimum value of 0 percent (%) and a maximum value of 100%; however, the present invention is not limited thereto. For example, when the SOC is expressed in 10-bit, during the digital signal processing procedure, it should be understood that the SOC can be expressed using a total of 1024 gray-scales ranging from 0 to 1023.

The remaining capacity detection circuit 200 comprises a coulomb counter circuit 202, a voltage detection circuit 204, an SOC calculation unit 206, a discharge correction unit 210, and a charge correction unit 230.

The coulomb counter circuit 202 generates a coulomb count value CC by integrating the charge and discharge currents ($I_{BAT}$) of the battery 102. The coulomb count value CC is expressed by the following equation.

$$CC=\int I_{BAT}dt$$

The coulomb counter circuit 202 samples the battery current $I_{BAT}$ using a specific sampling period $\Delta t$. The coulomb count value CC can be calculated using the battery current $I_{BATi}$ sampled at each time point according to the following equation.

$$CC=\Sigma_{i=1}(\Delta t \times I_{BATi})$$

The summation (integration) is carried out, for example, by setting the current $I_{BAT}$ flowing out from the battery 102 as positive and the current $I_{BAT}$ flowing into the battery 102 as negative.

The detection method for the current $I_{BAT}$ is not particularly limited. For example, it is also feasible to insert a sensor resistor $R_S$ that is serially connected with the battery 102 in the current $I_{BAT}$, so as to detect the voltage drop of the sensor resistor $R_S$. The sensor resistor $R_S$ can be inserted into the positive-electrode side or the negative-electrode side of the battery 102. The coulomb counter circuit 202 may also comprise an analog to digital (A/D) convertor for sampling the voltage drop $V_{CS}$ (or an amplified voltage of the voltage drop $V_{CS}$) of the sensor resistor $R_S$, and an integrator for integrating the output data from the A/D convertor.

The voltage detection circuit 204 monitors the voltage $V_{BAT}$ of the battery 102 and generates a data $DV_{BAT}$ (voltage data) representing the battery voltage $V_{BAT1}$. The voltage detection circuit 204 may also comprise an A/D convertor for sampling and digitalizing the battery voltage $V_{BAT}$ or a voltage in which $V_{BAT}$ is amplified by a specific coefficient.

The SOC calculation unit 206 receives the coulomb count value CC from the coulomb counter circuit 202. The SOC calculation unit 206 calculates the raw SOC value SOC_cc according to equation (1).

$$SOC\_cc=(CC_{FULL}-CC)/CC_{FULL}\times 100 \qquad (1),$$

where the $CC_{FULL}$ is the coulomb count capacitance equivalent to a fully charged battery.

The value SOC_cc and voltage data $DV_{BAT}$ are supplied to the discharge correction unit 210. The discharge correction unit 210 generates a discharge SOC value SOC_dis based on the above-described values. Specifically, the discharge correction unit 210 corrects the raw SOC value SOC_cc based on the voltage drop $V_{DROP}$ of the battery 102 during the discharging of the battery 102, and generates the discharge SOC value SOC_dis. The discharge correction unit 210 corrects the value of SOC_cc by setting SOC_dis to 0% when the battery voltage $V_{BAT}$ reaches the minimum operating voltage $V_{BAT\_MIN}$ of the system.

The charge correction unit 230 corrects the raw SOC value SOC_cc from the SOC calculation unit 206 during the charging of the battery 102, and generates a charge SOC value SOC_chg. The charge correction unit 230 measures the minimum value SOC_dis_min reached by the discharge SOC value SOC_dis during the last discharging (the latest discharging cycle) of the battery 102. Moreover, during the charging of the battery 102, the minimum value SOC_dis_min is used to calculate the charge SOC value SOC_chg.

The coulomb counter circuit 202 and the voltage detection circuit 204 may be installed with hardware only; alternatively, they may be integrated in a single integrated circuit (IC). The SOC calculation unit 206, the discharge correction unit 210, and the charge correction unit 230 can also be installed in a microcomputer or processors such as a central processing unit (CPU) that may be controlled by software. It is also feasible to integrate the whole remaining capacity detection circuit 200 in a single chip.

The SOC_dis and SOC_chg generated by the remaining capacity detection circuit 200 are expressed as numbers or as figure symbols representing the remaining capacity and are displayed in a display device so that the user may be presented with the same. Alternatively, the battery management system 100 uses the detected SOC as a warning of the decrease of the remaining capacity.

Figure 5:
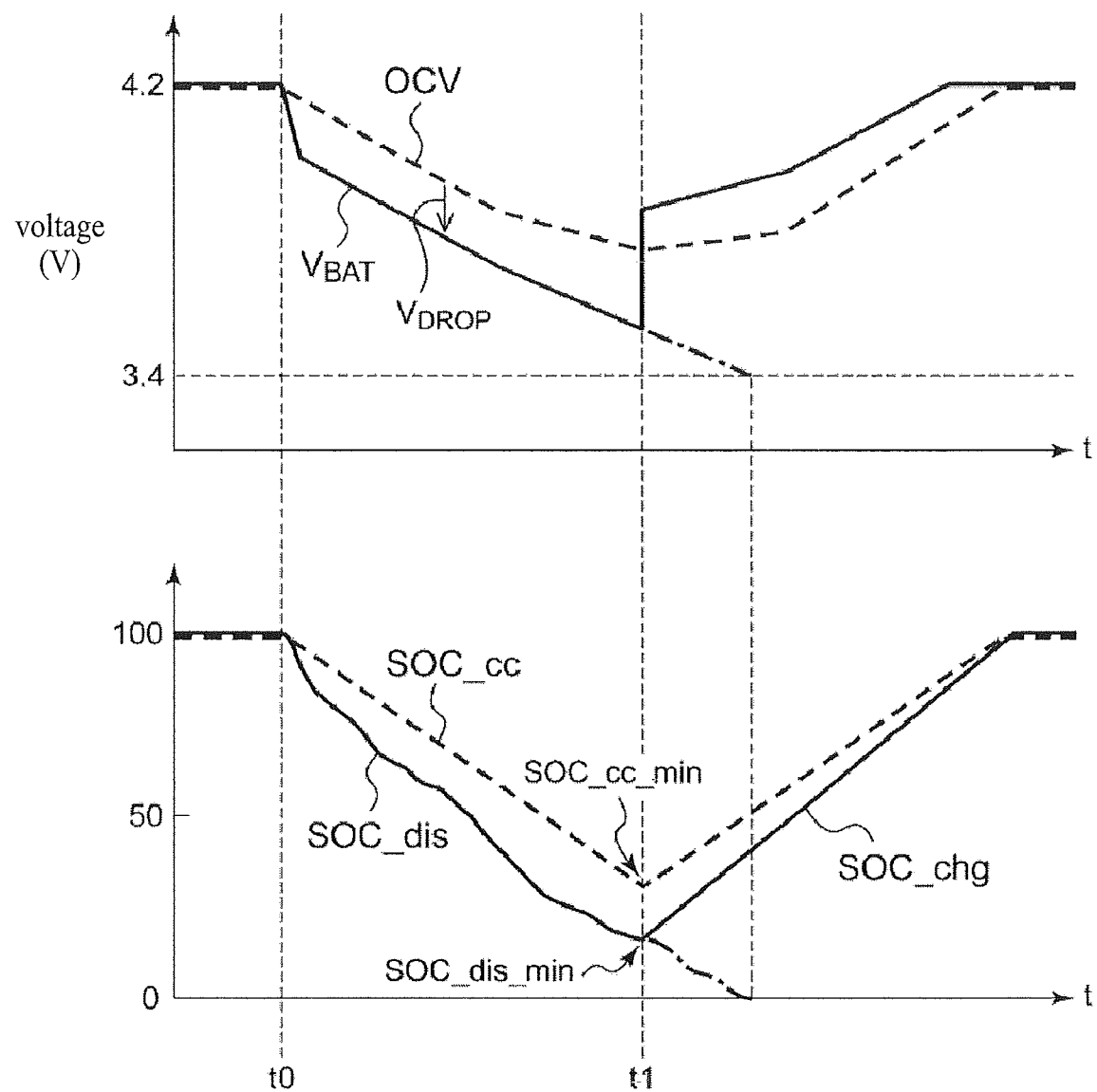
FIG. 5 is an operating waveform diagram of the remaining capacity detection circuit according to FIG. 4.

The above discussions are directed to the basic component of the remaining capacity detection circuit 200. The operation of the remaining capacity detection circuit 200 is described below. FIG. 5 is an operating waveform diagram of the remaining capacity detection circuit 200 illustrated in FIG. 4. The upper panel of FIG. 5 represents the time waveform of the OCV and battery voltage $V_{BAT}$, whereas the lower panel represents SOC_cc, SOC_dis and SOC_chg.

To facilitate understanding, the vertical axis and horizontal axis of the waveform diagram or timing diagram shown in the present disclosure are scaled up or down when appropriate; also, the waveform may be simplified, exaggerated, or highlighted to facilitate the understanding.

The battery starts to discharge at time point $t_0$. As used herein, to facilitate the understanding, the discharging current is set as a fixed value. In this case, the raw SOC value SOC_cc generated by the SOC calculation unit 206 decreases following a fixed slope. Also, the OCV decreases according to the remaining capacity of the battery. The battery voltage $V_{BAT}$ is lower than the OCV by the amount of the voltage drop $V_{DROP}$. The voltage drop $V_{DROP}$ depends on the amount of the discharging current, temperature, past discharging history, etc. The discharge SOC value SOC_dis is corrected by being set to 0% when the battery voltage $V_{BAT}$ equals the minimum operating voltage of 3.4V.

At time point $t_1$, the discharging ends and the charging starts. When the charging current is fixed, SOC_cc increases following a fixed slope. Further, during the charging, the battery voltage $V_{BAT}$ becomes greater than the OCV.

If SOC_cc is used as the SOC value during the charging, then at time point $t_1$, the SOC value increases drastically, causing the user to perceive an irregular operation.

The charge correction unit 230 measures the minimum value SOC_dis_min reached by SOC_dis during the previous discharging cycle (cycle $t_0$ to $t_1$). Further, when switching from the discharging cycle to the charging cycle, SOC_chg is generated in such a way that the deviation from the minimum value SOC_dis_min does not increase. In this way, when switching from discharging to charging, the unnatural change of the SOC presented to the user can be avoided.

More preferably, the charge correction unit 230 makes the charge SOC value SOC_chg and the minimum value SOC_dis_min the same at the time the charging starts (time point $t_1$). Moreover, the charge correction unit 230 then causes SOC_chg to approach 100% as the charging proceeds. In this way, the discontinuous jump of the SOC when the charging starts can be avoided.

For example, during the previous discharging cycle (period $t_0$ to $t_1$), the charge correction unit 230 also measures the minimum value SOC_cc_min reached by SOC_cc, in addition to the minimum value SOC_dis_min. Moreover, the charge correction unit 230 calculates the charge SOC value SOC_chg during the charging according to equation (1).

$$SOC\_chg=SOC\_dis\_min+(SOC\_cc-SOC\_cc\_min)\times(100-SOC\_dis\_min)/(SOC\_cc\_min) \quad (1)$$

In view of the foregoing, at time point $t_1$, SOC_chg as expressed by equation (1) results in the shift of SOC_cc by passing through SOC_dis_min. When SOC_cc becomes 100%, the slope is corrected by setting SOC_chg to 100%. According to the process, the charge SOC value SOC_chg may continuously increase from SOC_dis_min toward 100% during the charging.

(Second Embodiment)

Figure 6:
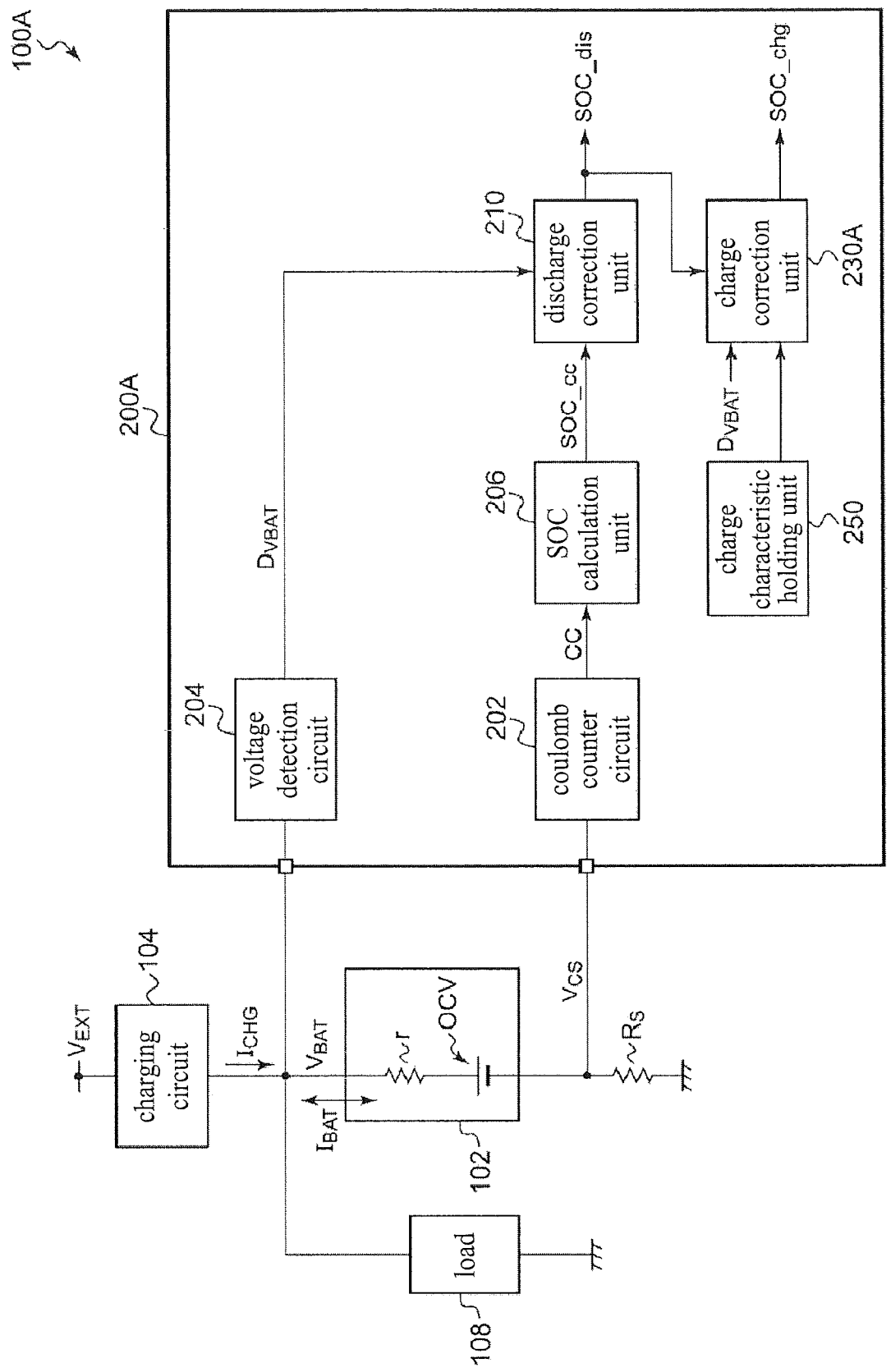
FIG. 6 is a block diagram of a battery management system comprising the remaining capacity detection circuit according to the second embodiment of the present disclosure.

FIG. 6 is a block diagram of a battery management system 100A comprising the remaining capacity detection circuit 200A according to the second embodiment of the present disclosure.

In addition to the remaining capacity detection circuit 200 illustrated in FIG. 4, the remaining capacity detection circuit 200A further comprises a charge characteristic holding unit 250. The charge characteristic holding unit 250 holds an SOC-VBAT characteristic representing a relationship between a voltage $V_{BAT}$ of the battery and SOC during the charging.

The charge correction unit 230A obtains an SOC value SOC_est corresponding to the voltage $V_{BAT}$ of the battery detected by the voltage detection circuit 204 based on the SOC-VBAT characteristic.

For example, the charge characteristic holding unit 250 may also be a look-up table. FIG. 7 shows an example of the SOC-VBAT characteristic. The charge correction unit 230A, by referencing to the look-up table, obtains the SOC value SOC_est. Regarding the intermediate values that are not stored in the look-up table, these values may be generated by linear interpolation.

Alternatively, the charge characteristic holding unit 250 may hold the SOC-VBAT characteristic in a way similar to the equation of $SOC=f(V_{BAT})$. $f( )$ is an approximation function. In this case, the charge correction unit 230A may also calculate the value of $f(V_{BAT})$ thereby generating SOC_est.

The charge correction unit 230A uses SOC_est to substitute SOC_cc, and generates SOC_chg according to equation (2).

$$SOC\_chg = SOC\_min + (SOC\_est - SOC\_cc\_min) \times (100 - SOC\_dis\_min)/(SOC\_cc\_min) \quad (2)$$

The discharging current of the battery varies depending on the load, but the charging current of the battery is stabilized to a specific value by means of the charging of the constant current (CC) of the charging circuit 104. In this case, the difference between the OCV and the battery voltage $V_{BAT}$ during the charging cycle can be predicted, and the SOC-VBAT characteristic representing the relationship between the voltage $V_{BAT}$ of the battery and the SOC during the charging cycle is fixed. Moreover, in a system in which the charging current can be switched, it is feasible to prepare an SOC-VBAT characteristic for each charging current. Also, in the situation where there is a temperature dependency, it is feasible to prepare an SOC-VBAT characteristic for each temperature.

According to the second embodiment, like the first embodiment, a natural SOC can be generated during the charging.

(Correction Process during the Discharging)

Examples of correction methods for discharging according to the present invention are described below; however, the present invention is not limited thereto.

Regarding the battery 102, the corresponding relationship (SOC-OCV characteristic) between the SOC and OCV (Open Circuit Voltage) is predetermined. FIG. 8 is a diagram showing an example of the SOC-OCV characteristic. For example, the SOC-OCV characteristic is stored in a look-up table (see FIG. 4, not shown in the present drawing). Regarding the intermediate values that are not stored in the look-up table, these values may be generated by linear interpolation. Alternatively, the discharge correction unit 210 may hold the SOC-OCV characteristic using a computation expression (e.g., the polynomial).

The discharge correction unit 210 generates an OCV value OCV1 corresponding to SOC_cc based on the SOC-OCV characteristic. Thereafter, a difference $V_{DROP1}$ between OCV1 and the voltage $V_{BAT1}$ of the battery detected by the voltage detection circuit 204 is generated.

$$V_{DROP1} = OCV1 - V_{BAT1}$$

The discharge correction unit 210 generates a value OCV2 greater than the minimum operating voltage $V_{BAT\_MIN}$ of a system by a voltage width $\Delta V$ corresponding to the difference $V_{DROP1}$.

$$OCV2 = V_{BAT\_MIN} + \Delta V$$

When $\Delta V = V_{DROP1}$, the above equation can be expressed as $OCV2 = V_{BAT\_MIN} + V_{DROP1}$. Alternatively, when $\Delta V = V_{DROP1} \times \alpha$ ($\alpha$ being a constant), the above equation can be expressed as $OCV2 = V_{BAT\_MIN} + V_{DROP1} \times \alpha$. Still alternatively, when $\Delta V = V_{DROP1} + \beta$ ($\beta$ being a constant), the above equation can be expressed as $OCV2 = V_{BAT\_MIN} + V_{DROP1} + \beta$; or the above equation can also be expressed as $OCV2 = V_{BAT\_MIN} + \alpha \times V_{DROP1} + \beta$.

To further generalize the equation, it is feasible to define a specific function f( ) to calculate the voltage width $\Delta V$ based on $\Delta V = f(V_{DROP1})$.

The discharge correction unit 210 generates an SOC value SOC2 corresponding to the value OCV2 based on the SOC-OCV characteristic. Moreover, the discharge correction unit 210 calculates the discharge SOC value SOC_dis if the value SOC2 corresponds to zero (0%) remaining capacity of the battery 102.

Figure 9:
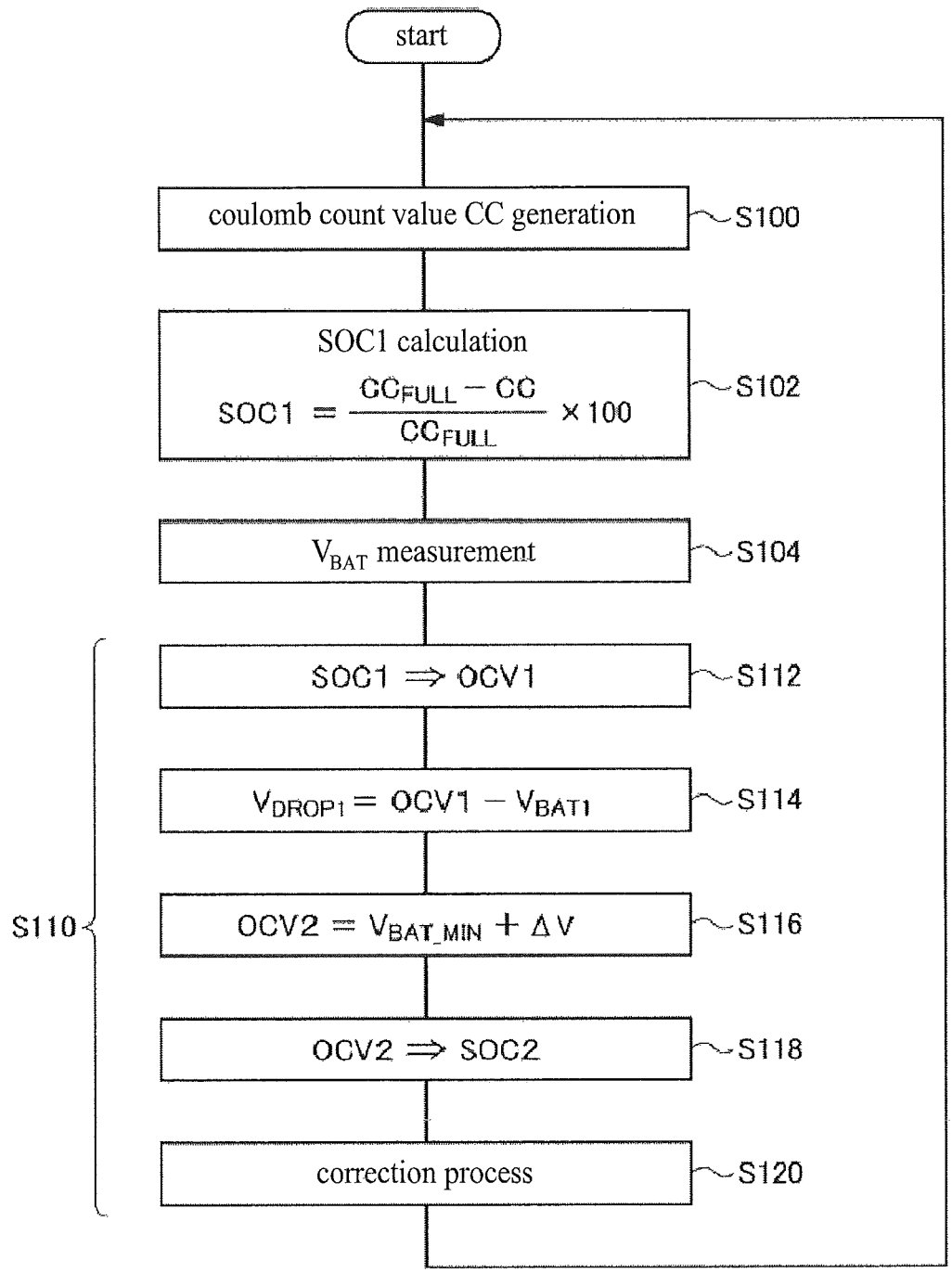
FIG. 9 is a flow diagram illustrating the procedure for detecting the remaining capacity according to one embodiment of the present disclosure.

FIG. 9 is a flow diagram illustrating the procedure for detecting the remaining capacity according to one embodiment of the present disclosure. For example, the process starts from a fully charged status. Moreover, the flow diagram is not used to limit the order in which each process (step) is carried out; rather the order of each process may be altered at will as long as the process does not fail. Further, the flow diagram does not imply that the frequencies (or cycles) at which processes are carried out are the same.

The coulomb counter circuit 202 calculates a coulomb count value CC (S100). The SOC calculation unit 206 uses the coulomb count value CC to calculate value SOC_cc based on equation (1) (S102). For example, it is also feasible that the coulomb counter circuit 202 updates the coulomb count value CC at the frequency of tens to hundreds Hz, while on the other hand, the SOC calculation unit 206 calculates SOC_cc at a lower frequency, such as 1 to 60 seconds per cycle.

The voltage detection circuit 204 measures $V_{BAT}$ (S104). In the case where the consumption of energy is negligible, the voltage detection circuit 204 can also measure the battery voltage $V_{BAT}$ at a higher frequency (for example, at a frequency that is the same as that of the coulomb counter circuit 202).

Next, the correction process S110 is performed. The correction process S110 may be carried out for each calculation of SOC_cc, or it may be carried out at a lower cycle.

Figure 10:
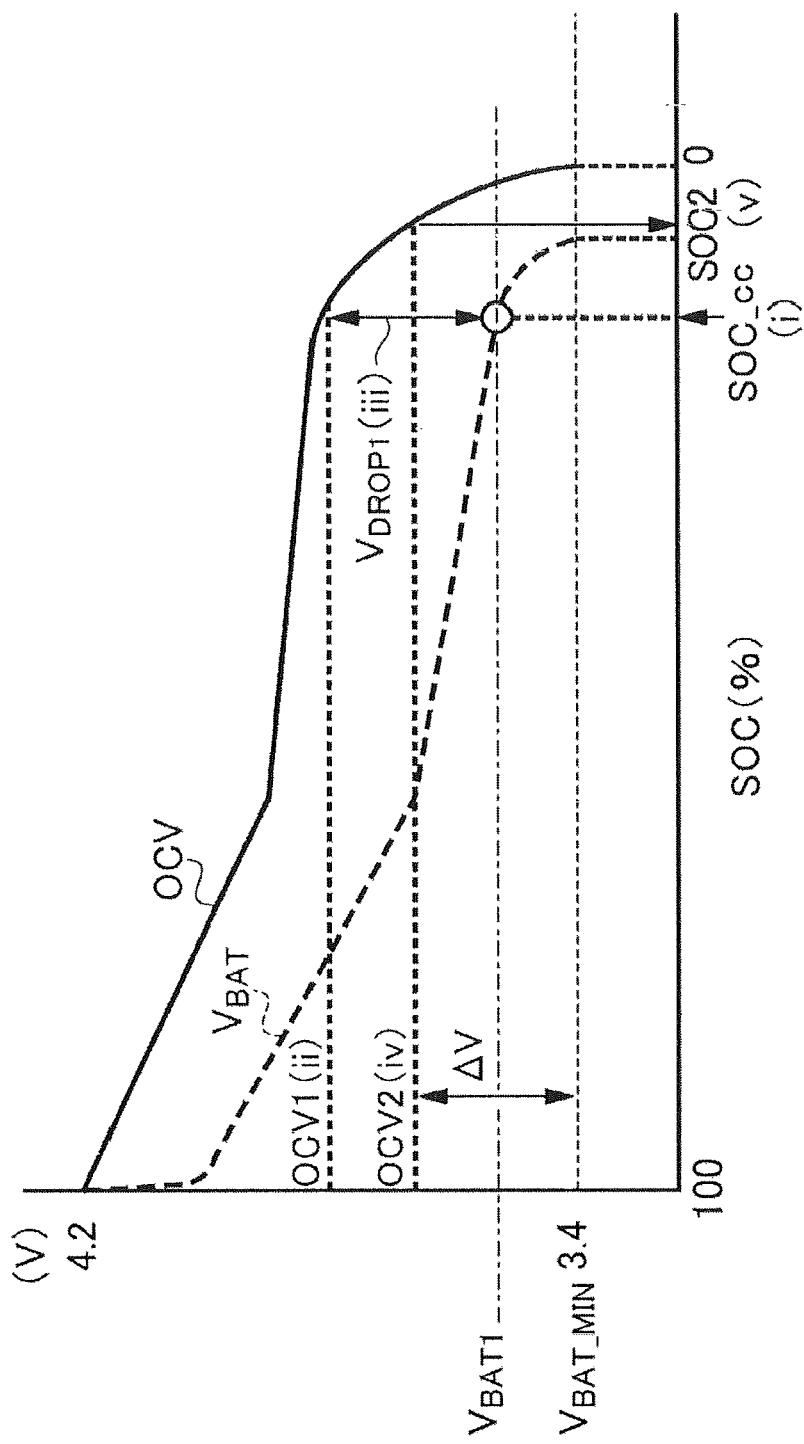
FIG. 10 is a diagram illustrating the correction process using the relationship between the voltage and the SOC.

FIG. 10 is a diagram illustrating the correction process S110 using the relationship between the voltage and the SOC. Each value is generated following the numbers (i) to (v) labelled therewith.

The discharge correction unit 210 converts SOC_cc into OCV1 based on the SOC-OCV characteristic (S112). Next, the voltage drop $V_{DROP1}$ is calculated (S114). Thereafter, when the detected value $V_{BAT1}$ of the battery voltage $V_{BAT}$ reaches the minimum operating voltage $V_{BAT\_MIN}$, the OCV value OCV2 is determined based on the voltage drop $V_{DROP1}$ and the minimum operating voltage $V_{BAT\_MIN}$ (S116). Next, the value OCV2 is reversely converted into an SOC value SOC2 that corresponds to OCV2 based on the SOC-OCV characteristic (S118).

The value SOC2 represents the SOC with which the system could be turned off. This means that when the SOC_cc calculated by the SOC calculation unit 206 is decreased to the value SOC2, then it is possible that the battery voltage $V_{BAT}$ is decreased to the minimum operating voltage $V_{BAT\_MIN}$, and hence the system could be turned off.

Therefore, during the correction process S120, the discharge SOC value SOC_dis is generated based on the value SOC2 under the condition that the value SOC2 corresponds to zero (0%) remaining capacity.

According to the above-described SOC correction process during the discharging, the voltage drop $V_{DROP}$ that changes over time is taken into consideration. The remaining capacity detection process based on the coulomb calculation method may be corrected in such a way that, when the battery voltage $V_{BAT}$ is decreased to the minimum operating voltage $V_{BAT\_MIN}$ (i.e., when the system is turned off), SOC is set to zero. In this way, the precision of the SOC detection may be improved.

Further, the present SOC correction process during the discharging shall not be confused with the SOC based on the voltage method. Both methods are common in that they utilize the SOC-OCV characteristic; however, the present SOC correction process does not require the process of OCV detection, and hence, it is not necessary to wait for the passage of a relaxed period.

Figure 11:
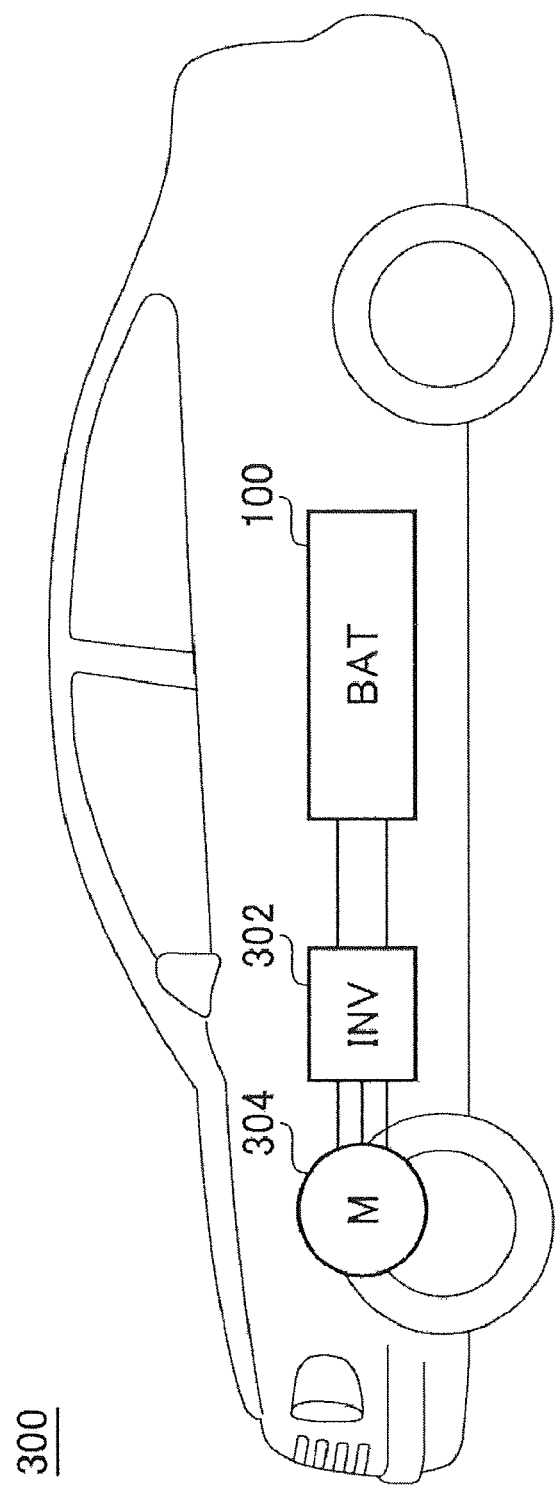
FIG. 11 is a schematic diagram illustrating a vehicle comprising the present battery management system.

Finally, the use of the battery management system 100 is discussed. FIG. 11 is a schematic diagram illustrating a vehicle 300 comprising the battery management system 100. The vehicle 300 is an electric vehicle (EV), a plug-in hybrid vehicle (PHV), a hybrid vehicle (HV), or the like. The inverter 302 receives a voltage $V_{BAT}$ from the battery management system 100 and converts the same into an alternating current voltage that is supplied to the motor 304 so that the motor 304 rotates. Further, in the situations in which the speed is reduced when, for example, the driver applies the brake, the inverter 302 carries out a recharging operation in which the current generated by the motor 304 is recharged to the battery 102 of the battery management system 100. Additionally, in the PHV or EV, the vehicle may further comprise a charging circuit for charging the battery 102 of the battery management system 100.

Figure 12:
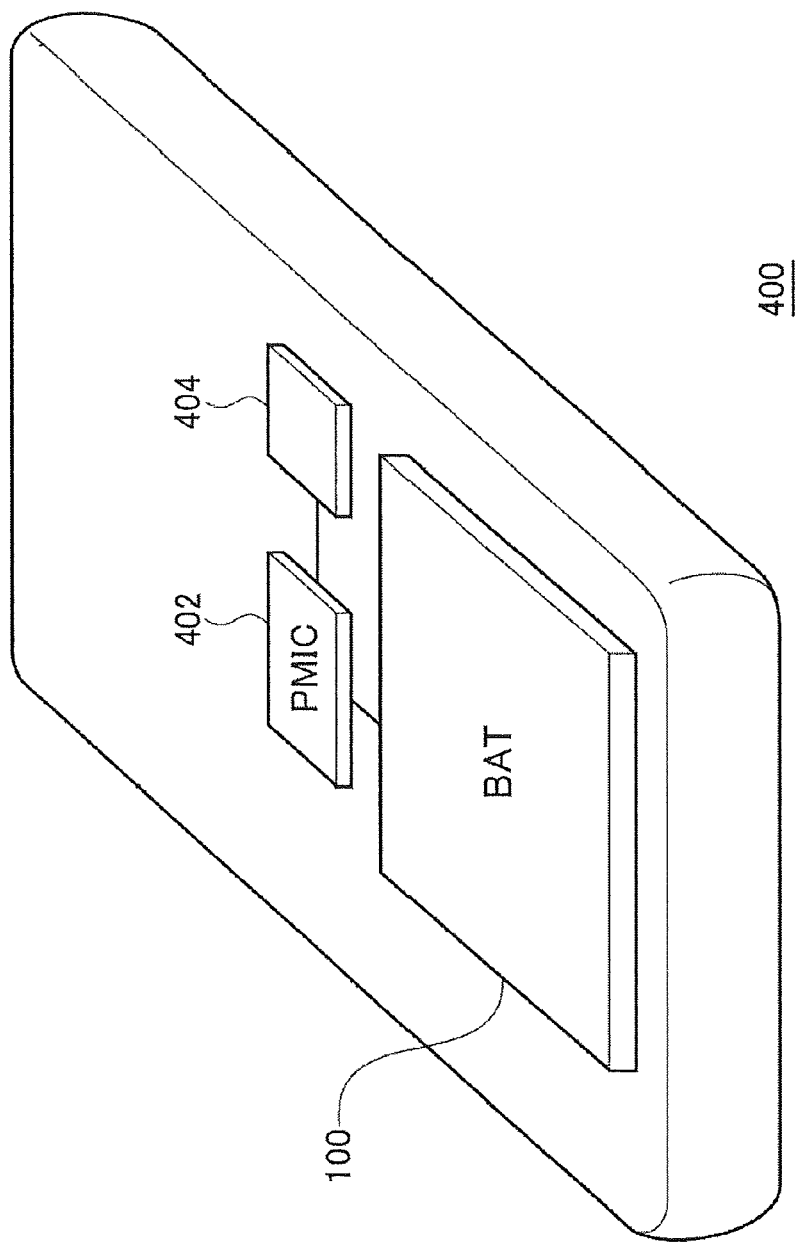
FIG. 12 is a schematic diagram illustrating an electronic machine comprising the present battery management system.

FIG. 12 is a schematic diagram illustrating an electronic machine 400 comprising the battery management system 100. The electronic machine 400 comprises, in addition to the battery management system 100, a power management integrated circuit (PMIC) 402, a processor 404, and other electronic circuits that are not shown. The PMIC 402 comprises multiple power circuits and is configured to supply a suitable power supply voltage for the processor 404 or other electronic circuits.

Moreover, the battery management system 100 can be used in industrial apparatuses, industrial machines, family/factory electricity storage systems, power supplies for elevator systems, etc.

The present invention has been discussed with a certain degree of particularity based on embodiments thereof. These embodiments, however, only disclose the principles and applications of the present invention, and these embodiments allow for various variations or alterations of the configuration without departing from the spirit or scope of this invention as defined by the appended claims.

What is claimed is:

1. A method of detecting an SOC (State Of Charge) of a rechargeable battery, comprising:
   generating a coulomb count value CC by integrating charge and discharge currents of the battery;
   calculating a raw SOC value SOC_cc based on the coulomb count value CC;
   correcting the raw SOC value SOC_cc based on a voltage drop of the battery and generating a discharge SOC value SOC_dis during discharging of the battery, where the voltage drop is defined as a difference between an open-circuit voltage and a detected voltage of the battery;
   obtaining a minimum value SOC_dis_min reached by the discharge SOC value SOC_dis during the discharging of the battery; and
   calculating a charge SOC value SOC_chg using the minimum value SOC_dis_min during charging of the battery.

2. The method of claim 1, wherein the charge SOC value SOC_chg is matched with the minimum value SOC_dis_min when the charging starts.

3. The method of claim 1, further comprising obtaining a minimum value SOC_cc_min reached by the raw SOC value SOC_cc during the discharging of the battery, wherein the charge SOC value SOC_chg during the charging is calculated according to:

SOC_chg=SOC_dis_min+(SOC_cc−SOC_cc_min)×(100−SOC_dis_min)/(SOC_cc_min).

4. The method of claim 1, further comprising:
   preliminarily defining an SOC-VBAT characteristic representing a relationship between an SOC and a voltage of the battery during the charging;
   obtaining a voltage of the battery during the charging of the battery; and
   obtaining an SOC value SOC_est corresponding to the obtained voltage of the battery based on the SOC-VBAT characteristic.

5. The method of claim 4, further comprising obtaining a minimum value SOC_cc_min reached by the raw SOC value SOC_cc during the discharging of the battery, wherein the charge SOC value SOC_chg during the charging is calculated according to:

SOC_chg=SOC_dis_min+(SOC_est−SOC_cc_min)×(100−SOC_dis_min)/(SOC_cc_min).

6. The method of claim 1, wherein the generating a discharge SOC value SOC_dis comprises:
   generating an OCV value OCV1 corresponding to the raw SOC value SOC_cc based on the SOC-OCV characteristic showing a relationship between an SOC of the battery and an OCV (Open Circuit Voltage);
   detecting a voltage $V_{BAT}$ of the battery;
   generating a difference $V_{DROP1}$ between the OCV value OCV1 and a detection value $V_{BAT1}$ of the voltage $V_{BAT}$ of the battery;
   generating a value OCV2 greater than a minimum operating voltage $V_{BAT\_MIN}$ of a system by a voltage width $\Delta V$ corresponding to the difference $V_{DROP1}$;
   generating an SOC value SOC2 corresponding to the OCV value OCV2 based on the SOC-OCV characteristic; and
   generating the discharge SOC value SOC_dis if the SOC value SOC2 corresponds to zero remaining capacity.

7. The method of claim 6, wherein $\Delta V = V_{DROP1}$.

8. A method of detecting an SOC (State Of Charge) of a rechargeable battery, comprising:
   generating a discharge SOC value SOC_dis based on a voltage drop of the battery during discharging of the battery, wherein the voltage drop is defined as a difference between an open-circuit voltage and a detected voltage of the battery;
   obtaining a minimum value SOC_dis_min reached by the discharge SOC value SOC_dis during the discharging of the battery; and
   generating a charge SOC value SOC_chg during charging of the battery such that a value matches the minimum value SOC_dis_min when the charging starts.

9. A remaining capacity detection circuit for detecting an SOC (State Of Charge) of a rechargeable battery, comprising:
   a coulomb counter circuit for generating a coulomb count value CC by integrating charge and discharge currents of the battery;
   a voltage detection circuit for detecting a voltage $V_{BAT}$ of the battery;
   an SOC calculation unit for calculating a raw SOC value SOC_cc based on the coulomb count value CC;
   a discharge correction unit for correcting the raw SOC value SOC_cc based on a voltage drop of the battery during discharging of the battery, and generating a discharge SOC value SOC_dis, wherein the voltage drop is defined as a difference between an open-circuit voltage and a detected voltage of the battery; and
   a charge correction unit for measuring a minimum value SOC_dis_min reached by the discharge SOC value SOC_dis during last discharging of the battery, and calculating a charge SOC value SOC_chg using the minimum value SOC_dis_min during charging of the battery.

10. The remaining capacity detection circuit of claim 9, wherein the charge SOC value SOC_chg matches the minimum value SOC_dis_min when the charging starts.

11. The remaining capacity detection circuit of claim 9, wherein the charge correction unit further measures a minimum value SOC_cc_min reached by the raw SOC value SOC_cc during the discharging of the battery, and calculates the charge SOC value SOC_chg during the charging according to:

SOC_chg=SOC_dis_min+(SOC_cc−SOC_cc_min)× (100−SOC_dis_min)/(SOC_cc_min).

12. The remaining capacity detection circuit of claim 9, further comprising a charge characteristic holding unit for holding an SOC-VBAT characteristic representing a relationship between a voltage $V_{BAT}$ of the battery and SOC during the charging, wherein the charge correction unit obtains an SOC value SOC_est corresponding to a voltage of the battery detected by the voltage detection circuit based on the SOC-VBAT characteristic.

13. The remaining capacity detection circuit of claim 12, wherein the charge correction unit calculates the charge SOC value SOC_chg during the charging according to:

SOC_chg=SOC_dis_min+(SOC_est−SOC_cc_min)× (100−SOC_dis_min)/(SOC_cc_min).

14. The remaining capacity detection circuit of claim 9, wherein the discharge correction unit executes:
  generating an OCV value OCV1 corresponding to the raw SOC value SOC_cc based on the SOC-OCV characteristic showing a relationship between an SOC of the battery and an OCV (Open Circuit Voltage);
  generating a difference $V_{DROP1}$ between the value OCV1 and a detection value $V_{BAT1}$ of a voltage of the battery detected by the voltage detection circuit;
  generating a voltage width ΔV and a high value OCV2 corresponding to the difference $V_{DROP1}$ from a minimum operating voltage $V_{BAT\_MIN}$ of a system;
  generating an SOC value SOC2 corresponding to the value OCV2 based on the SOC-OCV characteristic; and
  generating the discharge SOC value SOC_dis if the SOC value SOC2 corresponds to zero remaining capacity.

15. The remaining capacity detection circuit of claim 14, wherein ΔV=$V_{DROP1}$.

16. An electronic machine, comprising:
  a rechargeable battery; and the remaining capacity detection circuit of claim 9 for detecting an SOC of the battery.

17. A vehicle, comprising:
  a rechargeable battery; and
  the remaining capacity detection circuit of claim 9 for detecting an SOC of the battery.

18. A remaining capacity detection circuit for detecting an SOC (State Of Charge) of a rechargeable battery, comprising:
  a coulomb counter circuit for generating a coulomb count value CC by integrating charge and discharge currents of the battery;
  a voltage detection circuit for detecting a voltage $V_{BAT}$ of the battery;
  an SOC calculation unit for calculating a raw SOC value SOC_cc based on the coulomb count value CC;
  a discharge correction unit for correcting the raw SOC value SOC_cc based on a voltage drop of the battery during discharging of the battery, and generating a discharge SOC value SOC_dis, wherein the voltage drop is defined as a difference between an open-circuit voltage and a detected voltage of the battery; and
  a charge correction unit for measuring a minimum value SOC_dis_min reached by the discharge SOC value SOC_dis during last discharging of the battery, and calculating a charge SOC value SOC_chg during charging of the battery such that a value becomes the minimum value SOC_dis_min when the charging starts.

* * * * *